United States Patent
Nishida et al.

(10) Patent No.: US 12,344,931 B2
(45) Date of Patent: Jul. 1, 2025

(54) METHOD OF PRODUCING COPPER-CONTAINING LAYER

(71) Applicant: ADEKA CORPORATION, Tokyo (JP)

(72) Inventors: Akihiro Nishida, Tokyo (JP); Atsushi Yamashita, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 138 days.

(21) Appl. No.: 17/782,403

(22) PCT Filed: Dec. 1, 2020

(86) PCT No.: PCT/JP2020/044618
§ 371 (c)(1),
(2) Date: Jun. 3, 2022

(87) PCT Pub. No.: WO2021/117540
PCT Pub. Date: Jun. 17, 2021

(65) Prior Publication Data
US 2023/0041933 A1 Feb. 9, 2023

(30) Foreign Application Priority Data
Dec. 12, 2019 (JP) .................. 2019-224367

(51) Int. Cl.
*C23C 16/18* (2006.01)
*C07F 1/08* (2006.01)
(Continued)

(52) U.S. Cl.
CPC ............. *C23C 16/18* (2013.01); *C07F 1/08* (2013.01); *C09D 1/00* (2013.01); *C23C 16/45536* (2013.01); *C23C 16/45553* (2013.01)

(58) Field of Classification Search
CPC ............. C23C 16/18; C23C 16/45536; C23C 16/45553; C07F 1/08; C09D 1/00
See application file for complete search history.

(56) References Cited

U.S. PATENT DOCUMENTS

| | | | |
|---|---|---|---|
| 9,914,995 B2 | 3/2018 | Liu et al. | |
| 2012/0321817 A1* | 12/2012 | Dussarrat | C23C 16/45542 427/569 |

(Continued)

FOREIGN PATENT DOCUMENTS

| | | |
|---|---|---|
| JP | 2007-502551 | 2/2007 |
| JP | 2012-532993 | 12/2012 |

(Continued)

OTHER PUBLICATIONS

Extended European Search Report issued Dec. 5, 2023 in European Patent Application No. 20899821.1.

(Continued)

*Primary Examiner* — Nathan T Leong
(74) *Attorney, Agent, or Firm* — Wenderoth, Lind & Ponack, L.L.P.

(57) ABSTRACT

Provided is a method of producing a copper-containing layer, including: step 1: a step of reducing a surface of a substrate, provided that a substrate having a surface formed of a silicic acid compound is excluded, through use of a reducing agent; and step 2: a step of forming a copper-containing layer on the surface having been reduced in the step 1 through use of a thin-film forming raw material containing a copper compound by a plasma atomic layer deposition method.

5 Claims, 2 Drawing Sheets

(51) Int. Cl.
  *C09D 1/00* (2006.01)
  *C23C 16/455* (2006.01)

(56) References Cited

U.S. PATENT DOCUMENTS

2013/0330473 A1* 12/2013 Winter .............. C23C 16/45553
  75/392
2016/0032455 A1   2/2016 Liu et al.

FOREIGN PATENT DOCUMENTS

| TW | 201829834 | 8/2018 |
| WO | 2004/114398 | 12/2004 |
| WO | 2011/006035 | 1/2011 |

OTHER PUBLICATIONS

Wu, Liqi et al., "Hydrogen plasma-enhanced atomic layer deposition of copper thin films", Journal of Vacuum Science and Technology, vol. 25, No. 6, Dec. 2007, pp. 2581-2585.
International Search Report issued Feb. 2, 2021 in International (PCT) Application No. PCT/JP2020/044618.
Gordon et al., "Trends in Copper Precursor Development for CVD and ALD Applications", ECS Journal of Solid State Science and Technology, vol. 4, No. 1, 2015, pp. N3188-N3197.

* cited by examiner

METHOD OF PRODUCING COPPER-CONTAINING LAYER

TECHNICAL FIELD

The present invention relates to a method of producing a copper-containing layer having a low electrical resistivity.

BACKGROUND ART

In a semiconductor, the number of elements per unit area is increased and a distance between elements is shortened by narrowing a wiring width and a wiring distance of a metal wiring circuit, and thus a drive voltage can be reduced. As a result, the semiconductor thus highly integrated can achieve a high-speed operation and a low-power consumption operation. Through utilization of the semiconductor, an electronic device can achieve downsizing/weight saving and improvements in function and performance, and reductions in power consumption and cost. However, when the wiring width is narrowed, there is a high risk in that electromigration occurs owing to increases in resistance per unit length and current density, resulting in a failure of the semiconductor. Accordingly, a semiconductor using copper, which is less liable to be affected by the electromigration, as a conductive material has increasingly been manufactured.

As the semiconductor using copper as a conductive material, for example, in Patent Document 1, there is a proposal of a product in which a tantalum layer is formed by a physical vapor deposition (PVD) method on a tantalum nitride layer formed by an atomic layer deposition (ALD) method, and further, copper is formed by the PVD method on the tantalum layer. In Non Patent Document 1, there is a description that a metal film of copper, which is formed on a substrate formed of silica, titanium nitride, tantalum, or the like through use of a copper complex by a plasma ALD method, has a low electrical resistivity.

CITATION LIST

Patent Document

Patent Document 1: JP 2007-502551 A

Non Patent Document

Non Patent Document 1: "Trends in Copper Precursor Development for CVD and ALD Applications", ECS Journal of Solid State Science and Technology, 4(1), N3188-N3197, (2015)

SUMMARY OF INVENTION

Technical Problem

In the case where a substrate is formed of a metal, when a copper thin-film having a thickness of 20 nm or less is to be formed thereon through use of a copper compound by an ALD method, there is a problem in that copper is liable to bond on a metal surface of the substrate, and hence coarse particles of copper are generated to make the structure of the thin-film heterogeneous, resulting in an increase in electrical resistivity of the thin-film. When a copper thin-film is formed through use of a copper complex by a plasma ALD method, a thin-film having a relatively low electrical resistivity can be produced with less impurities. However, along with miniaturization of the semiconductor, there is a demand for a further reduction in electrical resistivity of a copper-containing layer.

Solution to Problem

The inventors of the present invention have repeated investigations, and as a result, have found that a copper-containing layer produced through specific steps can solve the above-mentioned problem. Thus, the inventors have completed the present invention.

That is, according to one embodiment of the present invention, there is provided a method of producing a copper-containing layer, including: step 1: a step of reducing a surface of a substrate, provided that a substrate having a surface formed of a silicic acid compound is excluded, through use of a reducing agent; and step 2: a step of forming a copper-containing layer on the surface having been reduced in the step 1 through use of a thin-film forming raw material containing a copper compound by a plasma atomic layer deposition method.

In the method of producing a copper-containing layer according to the one embodiment of the present invention, a thickness of the copper-containing layer is preferably 20 nm or less.

In the method of producing a copper-containing layer according to the one embodiment of the present invention, the reducing agent is preferably at least one selected from the group consisting of: hydrogen; ammonia; hydrazine; monosilane; disilane; diborane; trimethylaluminum; diethylzinc; and plasma thereof.

In the method of producing a copper-containing layer according to the one embodiment of the present invention, the substrate is preferably a metal substrate or a substrate having a metal film formed on a surface thereof.

In the method of producing a copper-containing layer according to the one embodiment of the present invention, the copper compound is preferably a copper compound represented by the following general formula (1):

where $R^1$, $R^2$, $R^5$, and $R^6$ each independently represent a hydrogen atom, an alkyl group having 1 to 4 carbon atoms, or a halogen atom, and $R^3$, $R^4$, $R^7$, and $R^8$ each independently represent an alkyl group having 1 to 4 carbon atoms or a halogen atom.

In the production method according to the one embodiment of the present invention, the step 1 is preferably performed within a range of from 20° C. to 400° C.

Advantageous Effects of Invention

According to the present invention, a copper-containing layer having a low electrical resistivity can be produced.

DESCRIPTION OF EMBODIMENTS

A method of producing a copper-containing layer of the present invention (hereinafter referred to as "production method of the present invention") is described.

Figure 1:
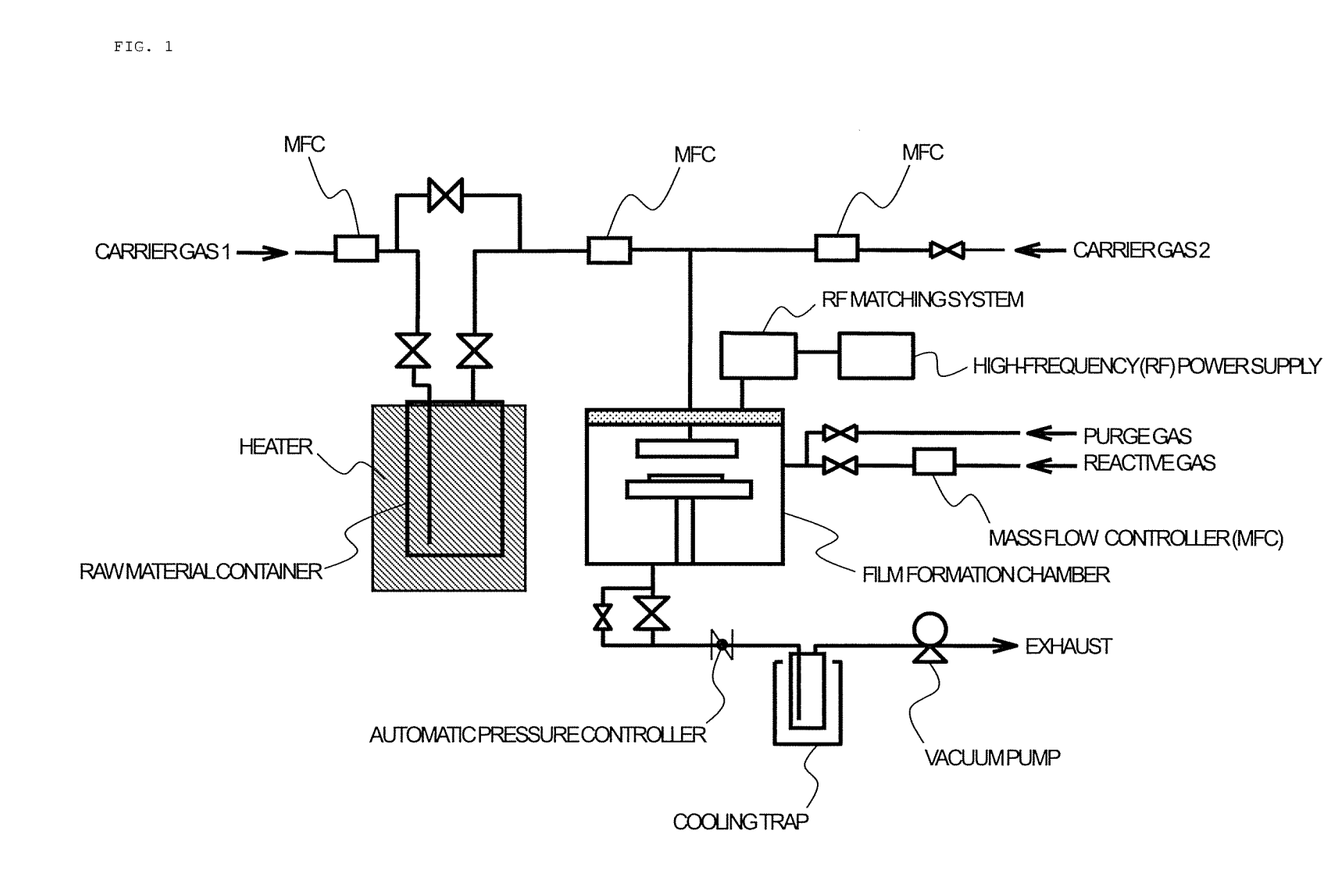
FIG. 1 is a schematic view for illustrating an example of a plasma ALD apparatus to be used in a production method of the present invention.
Figure 2:
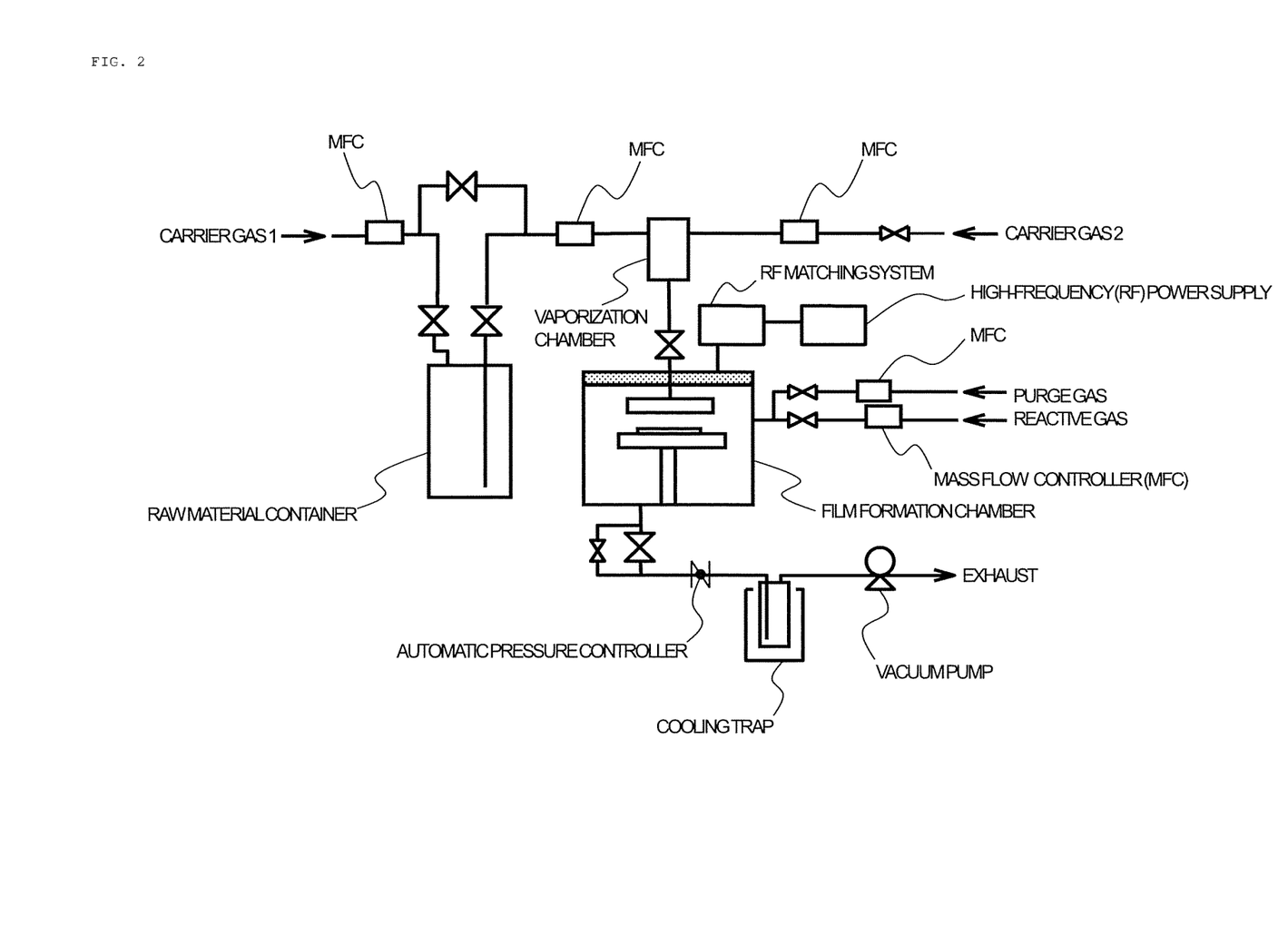
FIG. 2 is a schematic view for illustrating another example of the plasma ALD apparatus to be used in the production method of the present invention.

The production method of the present invention is characterized by including: a step 1 of reducing a substrate through use of a reducing agent; and a step 2 of, after the step 1, forming a copper-containing layer on the substrate through use of a thin-film forming raw material containing a copper compound by a plasma ALD method. A well-known plasma ALD apparatus enabling plasma treatment of a reactive gas may be used in the production method of the present invention. Specific examples of the plasma ALD apparatus include: an apparatus as illustrated in FIG. 1 capable of heating and/or decompressing the thin-film forming raw material in a raw material container, to thereby vaporize the raw material to obtain vapor, and supplying the vapor to a film formation chamber together with a carrier gas as required; and an apparatus as illustrated in FIG. 2 capable of transporting the thin-film forming raw material under the state of a liquid or a solution to a vaporization chamber, heating and/or decompressing the raw material in the vaporization chamber, to thereby vaporize the raw material to obtain vapor, and supplying the vapor to a film formation chamber. The apparatus is not limited to a single-substrate type apparatus including a film formation chamber as illustrated in each of FIG. 1 and FIG. 2, and an apparatus capable of simultaneously processing a large number of substrates through use of a batch furnace may also be used.

First, the step 1 of the production method of the present invention is described.

In the production method of the present invention, the step 1 is a process of subjecting the surface of the substrate to reduction treatment by bringing the reducing agent into contact with the surface of the substrate while applying heat to the substrate as required. It is preferred that the step 1 be performed by the plasma ALD apparatus, and it is preferred that the step 1 and the step 2 be continuously performed by the plasma ALD apparatus.

The substrate used in the production method of the present invention may be any substrate except a substrate having a surface formed of a silicic acid compound, and there are given, for example, a metal selected from the group consisting of: aluminum; silver; gold; lead; vanadium; manganese; magnesium; iron; cobalt; nickel; copper; chromium; palladium; molybdenum; tungsten; platinum; titanium; zirconium; and zinc, and an alloy, such as brass, bronze, steel, stainless steel, an aluminum alloy, a magnesium alloy, or a titanium alloy. Although the substrate having a surface formed of a silicic acid compound is excluded because the effect of the present invention cannot be obtained, a substrate having a metal film formed on the surface of the silicic acid compound may be used in the production method of the present invention. As a formation method for the metal film, there is given a method involving forming the metal film on the surface of the substrate through use of a metal compound by an ALD method or a CVD method. An example of the metal compound is "the other precursor" to be described later.

The shape of the substrate is, for example, a plate shape, a spherical shape, a fibrous shape, or a scaly shape. The surface of the substrate may be planar, or may have a three-dimensional structure, such as a trench structure.

(Reduction Treatment of Substrate)

In the step 1 of reducing the surface of the substrate in the production method of the present invention, for example, when the metal substrate or the substrate having a metal film formed on a surface thereof is used as the substrate, a metal is reduced by bringing the reducing agent (gas) into contact with the surface of the substrate. Specifically, it is appropriate to set the substrate in a film formation chamber of the plasma ALD apparatus, and introduce the reducing agent (gas) into the film formation chamber to reduce the surface of the substrate. In this case, the substrate may be heated, or heat may be applied thereto by heating the film formation chamber. The step 1 is preferably performed at a temperature within the range of from 20° C. to 400° C. When the temperature is less than 20° C., there is no apparatus that can be handled at the temperature. Meanwhile, when the temperature is more than 400° C., the substrate cannot withstand damage due to heat in some cases.

Examples of the reducing agent include hydrogen, carbon monoxide, hydrogen sulfide, sulfur dioxide, ammonia, hydrazine, monosilane, disilane, diborane, trimethylaluminum (TMA), and diethylzinc ($ZnEt_2$), and products obtained by subjecting those reducing agents to plasma treatment may also be used. In the production method of the present invention, at least one selected from the group consisting of: hydrogen; ammonia; hydrazine; monosilane; disilane; diborane; trimethylaluminum; diethylzinc; and plasma thereof is preferably used as the reducing agent. Of those, hydrogen plasma is more preferably used from the viewpoints of causing less damage to the substrate and less influence on film contamination, and enabling a reduction in film formation temperature. As an introduction method for the reducing agent into the film formation chamber, for example, decompression of the film formation chamber may be adopted.

As a plasma treatment method for the reducing agent, there is given, for example, a method involving radiating plasma emitted from a coil electrode to the reducing agent. Examples of the plasma include: capacitively coupled plasma generated by an electrostatic field caused by a high-frequency voltage applied to the coil electrode; and inductively coupled plasma by an induction field generated by a high-frequency current flowing through the coil electrode. Those plasmas can each be generated in a separate location from the substrate, and hence damage caused by the plasma to the substrate can be suppressed.

A plasma excitation frequency during the radiation of the plasma to the reducing agent is preferably 13.56 MHz, and a plasma output is preferably from 1 W to 600 W, more preferably from 20 W to 200 W. When the output is less than 20 W, the effect of the present invention may not be obtained. Meanwhile, when the output is more than 200 W, damage to the substrate may be increased.

(Evacuation Step)

After the reduction treatment of the substrate, the reducing agent (gas) is preferably evacuated from the film formation chamber. At this time, it is ideal that the reducing agent (gas) be completely evacuated from the film formation chamber, but it is not always required that the reducing agent (gas) be completely evacuated. As an evacuation method, there are given, for example, a method involving purging the inside of the film formation chamber with an inert gas, such as helium, nitrogen, or argon, a method involving performing evacuation by decompressing the inside of the film formation chamber, and a combination of these methods. The degree of decompression in the case of performing decompression falls within the range of preferably from 0.01 Pa to 300 Pa, more preferably from 0.01 Pa to 100 Pa.

Next, the step 2 of the production method of the present invention is described.

The step 2 is a process of forming the copper-containing layer on the surface having been reduced in the step 1 through use of the thin-film forming raw material containing a copper compound by the plasma ALD method. Specifically, the step 2 includes: a step (raw material gas introduction step) of introducing vapor obtained by vaporizing the thin-film forming raw material containing a copper compound and vapor of another precursor to be used as required (hereinafter referred to as "raw material gas") into the film formation chamber; a step (precursor layer formation step) of depositing the copper compound in the raw material gas on the surface of the substrate, to thereby form a precursor layer; a step (evacuation step) of evacuating the raw material gas remaining unreacted; and a step (copper-containing layer formation step) of introducing plasma of a reactive gas into the film formation chamber to cause the precursor layer and the plasma of the reactive gas to react with each other, to thereby form a copper-containing layer on the surface of the substrate. Now, each of the steps is described in detail.

(Raw Material Gas Introduction Step)

A step of vaporizing the thin-film forming raw material to obtain vapor (raw material gas) may be performed in a raw material container, or may be performed in a vaporization chamber after the thin-film forming raw material is introduced into the vaporization chamber.

In the raw material gas introduction step, as a transportation and supply method at the time of introducing the raw material gas into the film formation chamber, there are specifically given, for example: a gas transportation method involving heating and/or decompressing the thin-film forming raw material in a storage container (hereinafter referred to as "raw material container"), to thereby vaporize the raw material to obtain a raw material gas, and introducing the raw material gas into the film formation chamber (hereinafter referred to as "deposition reaction portion") having the substrate set therein together with a carrier gas, such as argon, nitrogen, or helium, as required as illustrated in FIG. 1; and a liquid transportation method involving transporting the thin-film forming raw material under the state of a liquid or a solution to the vaporization chamber, heating and/or decompressing the raw material in the vaporization chamber, to thereby vaporize the raw material to obtain a raw material gas, and introducing the raw material gas into the deposition reaction portion as illustrated in FIG. 2.

In the case of the gas transportation method, the copper compound itself may be used as the thin-film forming raw material. In the case of the liquid transportation method, the copper compound itself or a solution obtained by dissolving the copper compound in an organic solvent may be used as the thin-film forming raw material. The thin-film forming raw material may further contain a nucleophilic reagent or the like.

In addition, as an introduction method for the raw material gas into the deposition reaction portion, there are given a single source method and a cocktail source method, and any of these methods may be used. In addition, regardless of which method is used, the thin-film forming raw material is preferably vaporized at 20° C. to 200° C. In addition, when the thin-film forming raw material is vaporized to obtain vapor in the raw material container or in the vaporization chamber, the pressure in the raw material container and the pressure in the vaporization chamber preferably fall within the range of from 1 Pa to 10,000 Pa.

The copper compound contained in the thin-film forming raw material only needs to be capable of forming a thin-film of copper, and the structure of the copper compound is not particularly limited. However, when the copper compound has a molecular weight of more than 1,000, its melting point becomes too high, with the result that its utilization as the thin-film forming raw material may be difficult. The copper compound has a molecular weight of preferably less than 800, more preferably from 200 to 600. In addition, the copper compound has a melting point of preferably 50° C. or less, and is more preferably a liquid at normal temperature in order to ensure, in an apparatus for producing a thin-film through use of the thin-film forming raw material, transportability in piping of the apparatus.

Specific examples of the copper compound that may be used in the production method of the present invention include the following compound 1 to compound 32, but the present invention is not limited to these compounds. In the following compounds, "Me" represents a "methyl group", "Et" represents an "ethyl group", "iPr" represents an "iso-propyl group", "nPr" represents a "n-propyl group", "tBu" represents a "tert-butyl group", "sBu" represents a "sec-butyl group", "nBu" represents a "n-butyl group", and "SiMe₃" represents a "trimethylsilyl group".

-continued

Compound 5

Compound 6

Compound 7

Compound 8

Compound 9

Compound 10

Compound 11

Compound 12

-continued

Compound 13

Compound 14

Compound 15

Compound 16

Compound 17

Compound 18

Compound 19

Compound 20

Compound 21

Compound 22

Compound 23

Compound 24

Compound 25

Compound 26

Compound 27

Compound 28

Compound 29

Compound 30

Compound 31

Compound 32

In particular, a copper compound represented by the following general formula (1) may be preferably used in the production method of the present invention because the compound has a high vapor pressure and is excellent in thermal stability.

(1)

In the formula (1), $R^1$, $R^2$, $R^5$, and $R^6$ each independently represent a hydrogen atom, an alkyl group having 1 to 4 carbon atoms, or a halogen atom, and $R^3$, $R^4$, $R^7$, and $R^8$ each independently represent an alkyl group having 1 to 4 carbon atoms or a halogen atom.

The alkyl group having 1 to 4 carbon atoms represented by each of $R^1$ to $R^8$ in the above-mentioned general formula (1) may be linear or branched. Specific examples of the alkyl group having 1 to 4 carbon atoms include a methyl group, an ethyl group, a propyl group, an isopropyl group, a n-butyl group, a sec-butyl group, a tert-butyl group, and an isobutyl group. An alkyl group having more than 4 carbon atoms causes an increase in melting point, which may make the thin-film forming raw material unusable. The alkyl group preferably has 1 to 3 carbon atoms. Of the copper compounds represented by the above-mentioned general formula (1), a copper compound in which $R^1$ and $R^5$ each represent a methyl group, and $R^2$ and $R^6$ each represent a hydrogen atom is preferred, and a copper compound in which $R^1$ and $R^5$ each represent a methyl group, $R^2$ and $R^6$ each represent a hydrogen atom, and $R^3$, $R^4$, $R^7$, and $R^8$ each represent a group selected from the group consisting of: a methyl group; an ethyl group; and an isopropyl group is more preferred.

Examples of the halogen atom represented by each of $R^1$ to $R^8$ in the above-mentioned general formula (1) include a fluorine atom, a chlorine atom, a bromine atom, and an iodine atom. Of those, a chlorine atom is preferred.

Specific examples of the copper compound represented by the above-mentioned general formula (1) include the compound 5 to the compound 16 described above, but the production method of the present invention is not limited by these copper compounds.

A production method for the above-mentioned copper compound is not particularly limited, and the copper compound is produced through application of a well-known reaction. For example, the copper compound may be obtained by a production method described in JP 2015-218117 A.

The thin-film forming raw material only needs to contain the copper compound and be usable as a precursor of a thin-film, and the composition thereof varies depending on the kind of a target thin-film. For example, when a thin-film containing only copper as a metal is to be produced, the thin-film forming raw material is free of a metal compound other than copper and a semimetal compound. Meanwhile, when a thin-film containing copper and a metal other than copper and/or a semimetal is to be produced, the thin-film forming raw material may contain a compound containing a desired metal and/or a compound containing a semimetal (hereinafter referred to as "other precursor") in addition to the copper compound.

In addition, in a multi-component ALD method in which a plurality of precursors are used, there is no particular limitation on the other precursor that may be used together with the copper compound, and a well-known general precursor used for the thin-film forming raw material for an ALD method may be used.

Examples of the above-mentioned other precursor include compounds each formed of: one kind or two or more kinds selected from the group consisting of compounds used as organic ligands, such as an alcohol compound, a glycol compound, a β-diketone compound, a cyclopentadiene compound, and an organic amine compound; and a metal. In addition, examples of the kind of the metal in the precursor include lithium, sodium, potassium, magnesium, calcium, strontium, barium, titanium, zirconium, hafnium, vanadium, niobium, tantalum, chromium, tungsten, manganese, iron, osmium, ruthenium, cobalt, rhodium, iridium, nickel, palladium, platinum, silver, gold, zinc, aluminum, gallium, indium, germanium, tin, lead, antimony, bismuth, radium, scandium, ruthenium, yttrium, lanthanum, cerium, praseodymium, neodymium, promethium, samarium, europium, gadolinium, terbium, dysprosium, holmium, erbium, thulium, ytterbium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the β-diketone compound to be used as the organic ligand in the above-mentioned other precursor include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

Examples of the cyclopentadiene compound to be used as the organic ligand in the above-mentioned other precursor include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene.

Examples of the organic amine compound to be used as the above-mentioned organic ligand include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. An example of the production methods is given as described below. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal, and examples of the alkali metal alkoxide may include a sodium alkoxide, a lithium alkoxide, and a potassium alkoxide.

Examples of the multi-component ALD method as described above include: a method involving vaporizing and supplying each component of the thin-film forming raw material independently (hereinafter referred to as "single source method"); and a method involving vaporizing and supplying a mixed raw material obtained by mixing multi-component raw materials in accordance with desired composition in advance (hereinafter referred to as "cocktail source method").

In the case of the single source method, the above-mentioned other precursor is preferably a compound similar to the copper compound in the behavior of thermal decomposition and/or oxidative decomposition. In the case of the cocktail source method, the above-mentioned other precursor is preferably a compound that not only is similar to the copper compound in the behavior of thermal decomposition and/or oxidative decomposition but also is prevented from being altered through a chemical reaction or the like at the time of mixing.

In addition, in the case of the cocktail source method in the multi-component ALD method, a mixture of the copper compound and the other precursor, or a mixed solution obtained by dissolving the mixture in an organic solvent may be used as the thin-film forming raw material.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl pentyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixture thereof depending on the solubility of a solute, the relationship among the use temperature, boiling point, and flash point of the solvent, and the like.

When the thin-film forming raw material to be used in the production method of the present invention is the above-mentioned mixed solution, the thin-film forming raw material is prepared so that the amount of the entire precursors in the thin-film forming raw material is preferably from 0.01 mol/liter to 2.0 mol/liter, more preferably from 0.05 mol/liter to 1.0 mol/liter.

The amount of the entire precursors refers to the amount of the copper compound when the thin-film forming raw material is free of the metal compound other than the copper compound and the semimetal compound, and to the total amount of the copper compound and the other precursor when the thin-film forming raw material contains the other precursor.

In addition, the thin-film forming raw material to be used in the production method of the present invention may contain a nucleophilic reagent as required in order to improve the stability of each of the copper compound and the other precursor. Examples of the nucleophilic reagent include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The amount of the nucleophilic reagent falls within the range of preferably from 0.1 mol to 10 mol, more preferably from 1 mol to 4 mol with respect to 1 mol of the amount of the entire precursors.

In the production method of the present invention, it is desired that the thin-film forming raw material be prevented from including impurity metal elements other than the components for forming the raw material, impurity halogens such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, still more preferably 1 ppm or less. The total content of the impurity organic substances is preferably 500 ppm or less, more preferably 50 ppm or less, still more preferably 10 ppm or less. In addition, moisture causes generation of particles in the thin-film forming raw material and during thin-film formation. Accordingly, in order to reduce moisture in each of the precursor, the organic solvent, and the nucleophilic reagent, the moisture is desirably removed as much as possible in advance at the time of use. The moisture content of each of the precursor, the organic solvent, and the nucleophilic reagent is preferably 10 ppm or less, more preferably 1 ppm or less.

In addition, in the production method of the present invention, it is preferred that the thin-film forming raw material be prevented from including particles to the extent possible in order to reduce or prevent particle contamination of a thin-film to be formed. Specifically, in particle measurement with a light scattering liquid particle detector in a liquid phase, it is preferred that the number of particles larger than 0.3 µm be 100 or less in 1 ml of the liquid phase, and it is more preferred that the number of particles larger than 0.2 µm be 100 or less in 1 ml of the liquid phase.

(Precursor Layer Formation Step)

In the precursor layer formation step, the raw material gas is introduced to the substrate set in the deposition reaction portion to deposit the copper compound in the raw material gas on the surface of the substrate, to thereby form the precursor layer on the substrate. In this case, the substrate may be heated, or heat may be applied thereto by heating the deposition reaction portion. There are no particular limitations on the conditions under which the precursor layer is formed, but for example, a reaction temperature (substrate temperature), a reaction pressure, a deposition rate, and the like may appropriately be determined depending on the kind of the thin-film forming raw material. The reaction temperature is preferably not less than 20° C. that is the temperature at which the thin-film forming raw material sufficiently reacts, more preferably from 20° C. to 400° C., and the thin-film forming raw material is used within an ALD window adapted to the plasma of the reactive gas. The film thickness is controlled by the number of cycles so that a desired film thickness is obtained. The reaction pressure is preferably from 1 Pa to 10,000 Pa, more preferably from 10 Pa to 1,000 Pa.

When the thin-film forming raw material contains the other precursor than the copper compound, the other precursor is also deposited on the surface of the substrate together with the copper compound.

(Evacuation Step)

After the precursor layer formation step, the raw material gas not having been deposited on the surface of the substrate is evacuated from the deposition reaction portion. It is ideal that the raw material gas be completely evacuated from the deposition reaction portion, but it is not always required that the gas be completely evacuated. As an evacuation method, there are given, for example, a method involving purging the inside of the deposition reaction portion with an inert gas, such as helium, nitrogen, or argon, a method involving performing evacuation by decompressing the inside of the deposition reaction portion, and a combination of these methods. The degree of decompression in the case of performing decompression falls within the range of preferably from 0.01 Pa to 300 Pa, more preferably from 0.01 Pa to 100 Pa.

(Copper-Containing Layer Formation Step)

After the evacuation step, the plasma of the reactive gas is introduced into the deposition reaction portion so that the plasma of the reactive gas is caused to react with the precursor layer, that is, the copper compound having been deposited on the surface of the substrate through the action of the plasma of the reactive gas or through the action of the plasma of the reactive gas and the action of heat, to thereby form the copper-containing layer. The reactive gas may be introduced into the deposition reaction portion after the reactive gas is subjected to plasma treatment in advance, or may be subjected to plasma treatment in the deposition reaction portion. The plasma of the reactive gas may be generated by radiating plasma to the reactive gas. The conditions of the plasma treatment may be the same as those of the plasma treatment performed on the reducing agent in the step 1.

The reactive gas only needs to be a reactive gas that reacts with the precursor layer after being subjected to plasma treatment, and examples thereof include: oxidizing gases, such as hydrogen, oxygen, ozone, nitrogen dioxide, nitrogen monoxide, water vapor, hydrogen peroxide, formic acid, acetic acid, and acetic anhydride; reducing gases such as hydrogen; and nitriding gases, such as organic amine compounds including a monoalkylamine, a dialkylamine, a trialkylamine, and an alkylenediamine, hydrazine, and ammonia. The reactive gases may be used alone or as a mixture thereof. In the production method of the present invention, hydrogen plasma is preferably used as the plasma of the reactive gas because the effect of the present invention becomes remarkable.

When the reaction between the precursor layer and the plasma of the reactive gas is performed through the action of heat, the temperature thereof falls within the range of preferably from room temperature to 400° C., more preferably from 20° C. to 400° C. The temperature falls within the range of preferably from 20° C. to 200° C., more preferably from 20° C. to 150° C. because of the following reason: when the reaction between the precursor layer and the plasma of the reactive gas is performed at low temperature, carbon serving as an impurity can be suppressed from remaining in the copper-containing layer to be obtained. The pressure in the deposition reaction portion when the step 2 is performed is preferably from 1 Pa to 10,000 Pa, more preferably from 10 Pa to 2,000 Pa.

(Evacuation Step)

After the copper-containing layer formation step, the plasma of the reactive gas remaining unreacted and a by-product gas are evacuated from the deposition reaction portion as required. At this time, it is ideal that the reactive gas and the by-product gas be completely evacuated from the deposition reaction portion, but it is not always required that the gases be completely evacuated. An evacuation method and the degree of decompression in the case of performing decompression are the same as those in the above-mentioned evacuation step after the precursor layer formation step.

In the step 2 of the production method of the present invention, when deposition performed by a series of operations of the "raw material gas introduction step", the "precursor layer formation step", the "evacuation step", the "copper-containing layer formation step", and the "evacuation step" is defined as one cycle, and the cycle is repeated a plurality of times until a thin-film having a required film thickness is obtained, a copper-containing layer having a desired film thickness can be produced.

The deposition rate of the copper-containing layer may be controlled by the supply conditions (vaporization temperature and vaporization pressure) of the thin-film forming raw material, the reaction temperature between the thin-film forming raw material and the plasma of the reactive gas, and the reaction pressure. When the deposition rate is high, the characteristics of a copper-containing layer to be obtained may deteriorate. When the deposition rate is low, a problem may occur in productivity. Accordingly, the deposition rate is preferably from 0.01 nm/min to 100 nm/min, more preferably from 0.05 nm/min to 50 nm/min.

In addition, after the formation of the copper-containing layer, annealing treatment may be performed under an inert atmosphere, an oxidizing atmosphere, or a reducing atmosphere in order to obtain more satisfactory electrical characteristics. When step embedding is required, a reflow step may be provided. The temperature in this case is preferably from 200° C. to 1,000° C., more preferably from 250° C. to 500° C.

The thickness of the copper-containing layer obtained by the production method of the present invention is preferably 20 nm or less, more preferably 10 nm or less because the effect of the present invention becomes remarkable. In addition, the thickness of the copper-containing layer obtained by the production method of the present invention is preferably at least 1 nm.

The present invention provides a copper-containing thin-film having a low electrical resistivity. Such thin-film may cover a metal, an oxide ceramic, a nitride ceramic, or a glass substrate by appropriately selecting the other precursor, the reactive gas, and the production conditions. The thin-film produced by the production method of the present invention is excellent in electrical characteristics, and is hence suitable for the production of, for example, an electrode material for a memory element such as a DRAM element, a resistance film, a diamagnetic film used for the recording layer of a hard disk, and a catalyst material for a polymer electrolyte fuel cell.

EXAMPLES

The present invention is described in more detail below by way of Examples and the like. However, the present invention is by no means limited by Examples and the like below.

(1) Copper Compound

The following copper compound was used as a precursor and evaluated.

(2) Substrate

The following substrates A to C were each used in the production method of the present invention and evaluated.

Substrate A: a silica substrate having a ruthenium metal film (thickness: 20 nm) formed thereon by a PVD method Substrate B: the substrate A having a cobalt metal film (thickness: 15 nm) formed thereon by a PVD method Substrate C: silica substrate A copper-containing layer obtained by the production method of the present invention was evaluated by the following methods.

[1] Root Mean Square (RMS)

A RMS (nm) of a cross section of the copper-containing layer in a thickness direction was measured with FE-SEM. The RMS is an indicator of uniformity in thickness of the copper-containing layer, and it can be said that a lower RMS indicates that the copper-containing layer has more uniform thickness. The RMS is a root obtained by averaging the square of a deviation from an average line to a measurement curve, and is represented by the following formula (2).

$$RMS = \sqrt{\frac{1}{L}Z^2}\,(x)dx \qquad (2)$$

In the formula (2), L represents a reference length, and Z represents a height from the average line to the measurement curve.

[2] Electrical Resistivity

The electrical resistivity ($\mu\Omega cm$) of the copper-containing layer was measured by a four-terminal method.

[3] Thickness

The thickness (nm) of the copper-containing layer was measured through film thickness measurement by an X-ray reflectance method.

Examples 1 to 8 and Comparative Examples 1 to 5

First, as the step 1, after having been heated to a temperature shown in Table 1, the surface of the substrate was reduced by bringing hydrogen plasma obtained by subjecting a hydrogen gas to plasma treatment under the conditions of a RF output of 100 W and an irradiation time of 20 seconds into contact with the substrate for 20 seconds. The substrate to be used was selected from the substrates A to C. Next, as the step 2, a copper-containing layer was formed on the surface of the substrate under conditions 1 or 2 shown in Table 2 by a plasma ALD method. The evaluation results of the resultant copper-containing layer are shown in Table 1. In Comparative Example 5, the copper-containing layer was formed in the same manner as in Example 1 except that the step 1 was not performed on the substrate.

TABLE 1

|  | Substrate | Step 1 | Step 2 | RMS (nm) | ρ (μΩcm) | Thickness (nm) |
|---|---|---|---|---|---|---|
| Example 1 | A | Performed at 40° C. | Conditions 1 | 2.33 | 19 | 10.9 |
| Example 2 | B | Performed at 40° C. | Conditions 1 | 1.41 | 17 | 7.2 |
| Example 3 | A | Performed at 300° C. | Conditions 1 | 1.41 | 7.7 | 7.2 |
| Example 4 | B | Performed at 300° C. | Conditions 1 | 1.64 | 10 | 6.0 |
| Example 5 | A | Performed at 300° C. | Conditions 2 | 5.80 | 11.6 | 15.9 |
| Example 6 | B | Performed at 300° C. | Conditions 2 | 3.31 | 9.5 | 12.7 |
| Example 7 | A | Performed at 300° C. | Conditions 2 | 5.23 | 9.8 | 13.7 |
| Example 8 | B | Performed at 300° C. | Conditions 2 | 3.98 | 9.0 | 11.1 |
| Comparative Example 1 | C | Performed at 40° C. | Conditions 1 | Over load | Over load | 16.4 |
| Comparative Example 2 | C | Performed at 300° C. | Conditions 1 | Over load | $2.9 \times 10^5$ | 16.5 |

TABLE 1-continued

| | Substrate | Step 1 | Step 2 | RMS (nm) | ρ (μΩcm) | Thickness (nm) |
|---|---|---|---|---|---|---|
| Comparative Example 3 | C | Performed at 300° C. | Conditions 2 | Over load | 37 | 37.8 |
| Comparative Example 4 | C | Performed at 300° C. | Conditions 2 | Over load | Over load | 34.3 |
| Comparative Example 5 | B | Not performed | Conditions 1 | 2.56 | 22 | 9.0 |

TABLE 2

| | Conditions 1 | Conditions 2 |
|---|---|---|
| Precursor | (Cu complex structure, Me/Et substituents) | (Cu complex structure, Me/Et substituents) |
| Plasma of reactive gas | Hydrogen plasma | Hydrogen plasma |
| Formation method for thin-film | Plasma ALD method | Plasma ALD method |
| Substrate temperature | 40° C. | 40° C. |
| Pressure of deposition reaction portion | 106.7 Pa | 106.7 Pa |
| Introduction time of raw material gas | 20 seconds | 20 seconds |
| Evacuation time of raw material gas | 15 seconds | 15 seconds |
| Introduction time of plasma of reactive gas | 20 seconds | 20 seconds |
| Evacuation time of plasma of reactive gas | 15 seconds | 15 seconds |
| Number of cycles | 300 | 600 |

From the results of Comparative Examples 1 to 4, when the substrate (substrate C) having a surface formed of a silicic acid compound was used, a copper-containing layer having a uniform thickness could not be formed. In addition, from the results of Example 2 and Comparative Example 5, it was able to be recognized that the RMS and electrical resistivity of the copper-containing layer were reduced when the copper-containing layer was formed by the plasma ALD method after the surface of the substrate was reduced with hydrogen plasma as compared to when the copper-containing layer was formed by the plasma ALD method without reducing the surface of the substrate.

As described above, according to the production method of the present invention, a copper-containing layer having a uniform thickness and a low electrical resistivity can be formed.

The invention claimed is:

1. A method of producing a copper-containing layer, comprising:
    step 1: a step of reducing a surface of a substrate, provided that a substrate having a surface formed of a silicic acid compound is excluded, through use of a reducing agent; and
    step 2: a step of forming a copper-containing layer on the surface having been reduced in the step 1 through use of a thin-film forming raw material containing a copper compound represented by the following formula by a plasma atomic layer deposition method, wherein in step 2, a temperature of the substrate is set to from 20° C. to 40° C.:

wherein a thickness of the copper-containing layer produced by the method is from 1 nm to 10 nm.

2. The method of producing a copper-containing layer according to claim 1, wherein the reducing agent is at least one selected from the group consisting of:
    hydrogen; ammonia; hydrazine; monosilane; disilane; diborane; trimethylaluminum; diethylzinc; and plasma thereof.

3. The method of producing a copper-containing layer according to claim 1, wherein the substrate is a metal substrate or a substrate having a metal film formed on a surface thereof.

4. The method of producing a copper-containing layer according to claim 1, wherein the step 1 is performed within a range of from 20° C. to 400° C.

5. The method of producing a copper-containing layer according to claim 1, wherein a pressure during the deposition in step 2 is from 10 Pa to 2,000 Pa.

* * * * *